United States Patent
Lee

(10) Patent No.: US 8,071,179 B2
(45) Date of Patent: Dec. 6, 2011

(54) METHODS FOR INFUSING ONE OR MORE MATERIALS INTO NANO-VOIDS IF NANOPOROUS OR NANOSTRUCTURED MATERIALS

(75) Inventor: Howard W. H. Lee, Saratoga, CA (US)

(73) Assignee: Stion Corporation, San Jose, CA (US)

( * ) Notice: Subject to any disclaimer, the term of this patent is extended or adjusted under 35 U.S.C. 154(b) by 625 days.

(21) Appl. No.: 12/163,416

(22) Filed: Jun. 27, 2008

(65) Prior Publication Data
US 2009/0117718 A1 May 7, 2009

Related U.S. Application Data

(60) Provisional application No. 60/947,326, filed on Jun. 29, 2007.

(51) Int. Cl.
B05D 7/22 (2006.01)
B05D 3/00 (2006.01)

(52) U.S. Cl. ........ 427/532; 427/181; 427/238; 427/295; 427/398.1; 427/398.4

(58) Field of Classification Search .................. 427/180, 427/181, 226, 229, 238, 294, 295, 398.1 427/398.4, 532
See application file for complete search history.

(56) References Cited

U.S. PATENT DOCUMENTS

| | | | |
|---|---|---|---|
| 4,335,266 A | 6/1982 | Mickelsen et al. | |
| 4,441,113 A | 4/1984 | Madan | |
| 4,461,922 A | 7/1984 | Gay et al. | |
| 4,465,575 A | 8/1984 | Love et al. | |
| 4,471,155 A | 9/1984 | Mohr et al. | |
| 4,499,658 A | 2/1985 | Lewis | |
| 4,507,181 A | 3/1985 | Nath et al. | |
| 4,517,403 A | 5/1985 | Morel et al. | |
| 4,532,372 A | 7/1985 | Nath et al. | |
| 4,542,255 A | 9/1985 | Tanner et al. | |
| 4,581,108 A | 4/1986 | Kapur et al. | |

(Continued)

FOREIGN PATENT DOCUMENTS

AU 7865198 2/1999

(Continued)

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97. International Search Report & Written Opinion of PCT Application No. PCT/US 09/46161, date of mailing Jul. 27, 2009, 14 pages total.
International Search Report & Written Opinion of PCT Application No. PCT/US 09/46802, mailed on Jul. 31, 2009, 11 pages total.

(Continued)

Primary Examiner — Frederick Parker
Assistant Examiner — Michael Wieczorek
(74) Attorney, Agent, or Firm — Kilpatrick Townsend & Stockton LLP

(57) ABSTRACT

A method of forming composite nanostructures using one or more nanomaterials. The method provides a nanostructure material having a surface region and one or more nano void regions within a first thickness in the surface region. The method subjects the surface region of the nanostructure material with a fluid. An external energy is applied to the fluid and/or the nanostructure material to drive in a portion of the fluid into one or more of the void regions and cause the one or more nano void regions to be substantially filled with the fluid and free from air gaps.

27 Claims, 6 Drawing Sheets

U.S. PATENT DOCUMENTS

| | | |
|---|---|---|
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,724,011 A | 2/1988 | Turner et al. |
| 4,751,149 A | 6/1988 | Vijayakumar et al. |
| 4,775,425 A | 10/1988 | Guha et al. |
| 4,798,660 A | 1/1989 | Ermer et al. |
| 4,816,082 A | 3/1989 | Guha et al. |
| 4,915,745 A | 4/1990 | Pollock et al. |
| 4,950,615 A | 8/1990 | Basol et al. |
| 4,996,108 A | 2/1991 | Divigalpitiya et al. |
| 5,008,062 A | 4/1991 | Anderson et al. |
| 5,028,274 A | 7/1991 | Basol et al. |
| 5,039,353 A | 8/1991 | Schmitt |
| 5,045,409 A | 9/1991 | Eberspacher et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,180,686 A | 1/1993 | Banerjee et al. |
| 5,211,824 A | 5/1993 | Knapp |
| 5,231,047 A | 7/1993 | Ovshinsky et al. |
| 5,248,345 A | 9/1993 | Sichanugrist et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,474,939 A | 12/1995 | Pollock et al. |
| 5,501,744 A | 3/1996 | Albright et al. |
| 5,512,107 A | 4/1996 | Van den Berg |
| 5,536,333 A | 7/1996 | Foote et al. |
| 5,578,503 A | 11/1996 | Karg et al. |
| 5,665,175 A | 9/1997 | Safir |
| 5,676,766 A | 10/1997 | Probst et al. |
| 5,698,496 A * | 12/1997 | Fastnacht et al. ............. 505/470 |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,127,202 A | 10/2000 | Kapur et al. |
| 6,166,319 A | 12/2000 | Matsuyama |
| 6,310,281 B1 | 10/2001 | Wendt et al. |
| 6,328,871 B1 | 12/2001 | Ding et al. |
| 6,372,538 B1 | 4/2002 | Wendt et al. |
| 6,690,041 B2 | 2/2004 | Armstrong et al. |
| 6,852,920 B2 | 2/2005 | Sager et al. |
| 6,878,871 B2 | 4/2005 | Scher et al. |
| 7,194,197 B1 | 3/2007 | Wendt et al. |
| 7,319,190 B2 | 1/2008 | Tuttle |
| 2002/0063065 A1 | 5/2002 | Sonoda et al. |
| 2003/0075717 A1 | 4/2003 | Kondo et al. |
| 2004/0095658 A1 | 5/2004 | Buretea et al. |
| 2004/0110393 A1 | 6/2004 | Munzer et al. |
| 2004/0161539 A1* | 8/2004 | Miyakawa ................. 427/376.2 |
| 2004/0245912 A1 | 12/2004 | Thurk et al. |
| 2004/0252488 A1 | 12/2004 | Thurk |
| 2005/0287717 A1 | 12/2005 | Heald et al. |
| 2006/0034065 A1 | 2/2006 | Thurk |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0219288 A1 | 10/2006 | Tuttle |
| 2006/0219547 A1 | 10/2006 | Tuttle |
| 2006/0220059 A1 | 10/2006 | Satoh et al. |
| 2007/0116892 A1 | 5/2007 | Zwaap |
| 2007/0116893 A1 | 5/2007 | Zwaap |
| 2007/0089782 A1 | 6/2007 | Scheuten et al. |
| 2007/0151596 A1 | 6/2007 | Nasuno et al. |
| 2007/0169810 A1 | 6/2007 | Van Duern et al. |
| 2007/0283998 A1 | 12/2007 | Kuriyagawa et al. |
| 2007/0289624 A1 | 12/2007 | Kuriyagawa et al. |
| 2008/0032044 A1 | 2/2008 | Kuriyagawa et al. |
| 2008/0041446 A1 | 2/2008 | Wu et al. |
| 2008/0092945 A1 | 3/2008 | Munteanu et al. |
| 2008/0092953 A1 | 3/2008 | Lee |
| 2008/0105294 A1 | 5/2008 | Kushiya et al. |
| 2008/0110495 A1 | 5/2008 | Onodera et al. |

FOREIGN PATENT DOCUMENTS

| | | |
|---|---|---|
| AU | 2001/40599 A1 | 8/2001 |
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | WO 01/57932 A1 | 8/2001 |
| WO | WO 2005011002 | 2/2005 |
| WO | WO 2007/077171 A2 | 7/2007 |
| WO | WO 2008/025326 A2 | 3/2008 |

OTHER PUBLICATIONS

Onuma et al., Preparation and Characterization of CuInS Thin Films Solar Cells with Large Grain, Elsevier Science B.V; Solar Energy Materials & Solar Cells 69 (2001) pp. 261-269.

International Solar Electric Technology, Inc. (ISET) "Thin Film CIGS", http://www.isetinc.com/cigs.html, Oct. 1, 2008.

Kapur et al., "Fabrication of Light Weight Flexible CIGS Solar Cells for Space Power Applications", Mat. Res. Soc. Proc. vol. 668, (2001) ppH3.5.1-H3.5.6, Materials Research Society, Warrendale, PA 15086.

Kapur et al., Non-Vacuum Printing Process for CIGS Solar Cells on Rigid and Flexible Substrates 29th IEEE Photovoltaic Specialists Conf., New Orleans, LA, IEEE, (2002) p. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43 (2003).

Kapur et al., "Non-Vacuum Processing of $CuIn_{1-x}Ga_xSe_2$ Solar Cells on Rigid and Flexible Substrates using Nanoparticle Inks", Thin Solid Films, vol. 431-432 (2003) pp. 53-57 Proceedings of Symposium B, European Materials Research Society, Strasbourg, France.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Nanoparticle Oxides Precursor Inks for Thin Film Copper Indium Gallium Selenide (CIGS) Solar Cells", Mat. Res. Soc. Proc. vol. 668, (2001) ppH2.6.1-H2.6.7, Materials Research Society, Warrendale, PA 15086.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

* cited by examiner

US 8,071,179 B2

METHODS FOR INFUSING ONE OR MORE MATERIALS INTO NANO-VOIDS IF NANOPOROUS OR NANOSTRUCTURED MATERIALS

CROSS-REFERENCES TO RELATED APPLICATIONS

This application claims priority to U.S. Provisional Patent Application No. 60/947,326, filed Jun. 29, 2007, entitled "METHODS FOR INFUSING ONE OR MORE MATERIALS INTO NANO-VOIDS OF NANOPOROUS OR NONOSTRUCTURED MATERIALS" by inventor Howard W.H. Lee, commonly assigned and incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to photovoltaic materials. More particularly, the present invention provides a method and structure for manufacture of photovoltaic materials using a thin film process including Group IV materials (e.g., silicon, germanium) and metal oxides, such as copper oxide and the like. Merely by way of example, the present method and structure have been implemented using a nanostructure configuration, but it would be recognized that the invention may have other configurations.

From the beginning of time, human beings have been challenged to find ways of harnessing energy. Energy comes in the forms such as petrochemical, hydroelectric, nuclear, wind, biomass, solar, and more primitive forms such as wood and coal. Over the past century, modrn civilization has relied upon petrochemical energy as an important source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles, Calif. Clean sources of energy also include wind, waves, and the like. That is, large windmills often convert wind into more useful forms of energy such as electricity. Still other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. Often time, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, techniques related to nanostructure materials are provided. More particularly, embodiments according to the present invention provides a method and structure for forming composite nanostructure using a nanostructure material and driving a fluid into nano voids regions of the nanostructure material. Merely by way of example, the present method and structure have been implemented using a nanostructure configuration and a fluid, but it would be recognized that the invention may have other configurations.

In a specific embodiment, the present invention provides a method for forming nanostructure composite using one or more nano material, e.g., nanoparticles, quantum dots, quantum wires, nano-columns, nanorods, nanotubes, quantum wells, nanoshells, nanobelts, nanoporous materials. The method includes providing a nanostructure material having a surface region (e.g., flat, textured, patterned) and one or more nano void regions within a first thickness in a surface region. In a specific embodiment, the nanostructure material can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon-germanium alloys, Group III/V, or Group II/VI materials, and the like. Of course, there can be other variations, modifications, and alternatives. The method includes subjecting the surface region of the nanostructure material with a fluid. The method includes applying an external energy to the fluid and/or the nanostructure material to drive in a portion of the fluid into one or more of the nano void regions and cause the one or more nano void regions to be substantially filled with the fluid and free from air gaps. In a specific embodiment, the fluid is a liquid, which is substantially free from air gaps and the like.

In an alternative embodiment, a method for forming a nanostructure composite using one or more nano material is provided. The method includes providing a nanostructure material having one or more nano void regions. The method includes maintaining the nanostructure material in a vacuum environment and subjecting the one or more nano void regions with a fluid to while the nanostructure material is maintained in the vacuum environment. The one or more nano void regions are substantially filled with the fluid free from air gaps.

In an alternative specific embodiment a method of forming composite nanostructures using one or more nano materials (e.g., nanoparticles, quantum dots, quantum wires, nano-columns, nanorods, nanotubes, quantum wells, nanoshells, nanobelts, nanoporous materials) is provided. The method includes providing a nanostructure material having a surface region and one or more nano void regions within a thickness in a surface region. The method includes subjecting the surface region with a fluid and maintaining the nanostructure material including the fluid at a first temperature. In a specific embodiment, the first temperature is lower than at least a freezing temperature of the fluid. The method includes providing the nanostructure material including the fluid in a vacuum environment while maintaining the nanostructure material at the first temperature. The method increases the temperature of the nanostructure material from a first temperature to a second temperature to cause the one or more nano void regions to be filled with the fluid free from air gaps.

Depending upon the specific embodiment, one or more benefits may be achieved. The present technique provides an easy to use processes that relies upon conventional technology that is nanotechnology based. Additionally, the method provides a process that is compatible with conventional process technology without substantial modifications to conventional equipment and processes. In a specific embodiment, the present method and structure can also be provided using large scale manufacturing techniques, which reduce costs associated with the manufacture of the composite nanostructures. In a specific embodiment, the present method and structure can be provided using solution based processing. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings.

BRIEF DESCRIPTION OF THE DRAWINGS

FIG. 5-8 are simplified diagrams illustrating an alternative method of forming a nanostructure composite according to an embodiment of the present invention.

DETAILED DESCRIPTION OF THE INVENTION

According to the present invention, techniques related to nanostructure materials are provided. More particularly, the present invention provides a method and structure for forming nanostructure composite using a nanostructure material having one or more nano void region. Merely by way of example, the present method and structure have been implemented using a nanostructured morphology, but it would be recognized that the invention may have other morphologies. Further details of the embodiments of the present invention can be found throughout the present specification and more particularly below.

Figure 1:
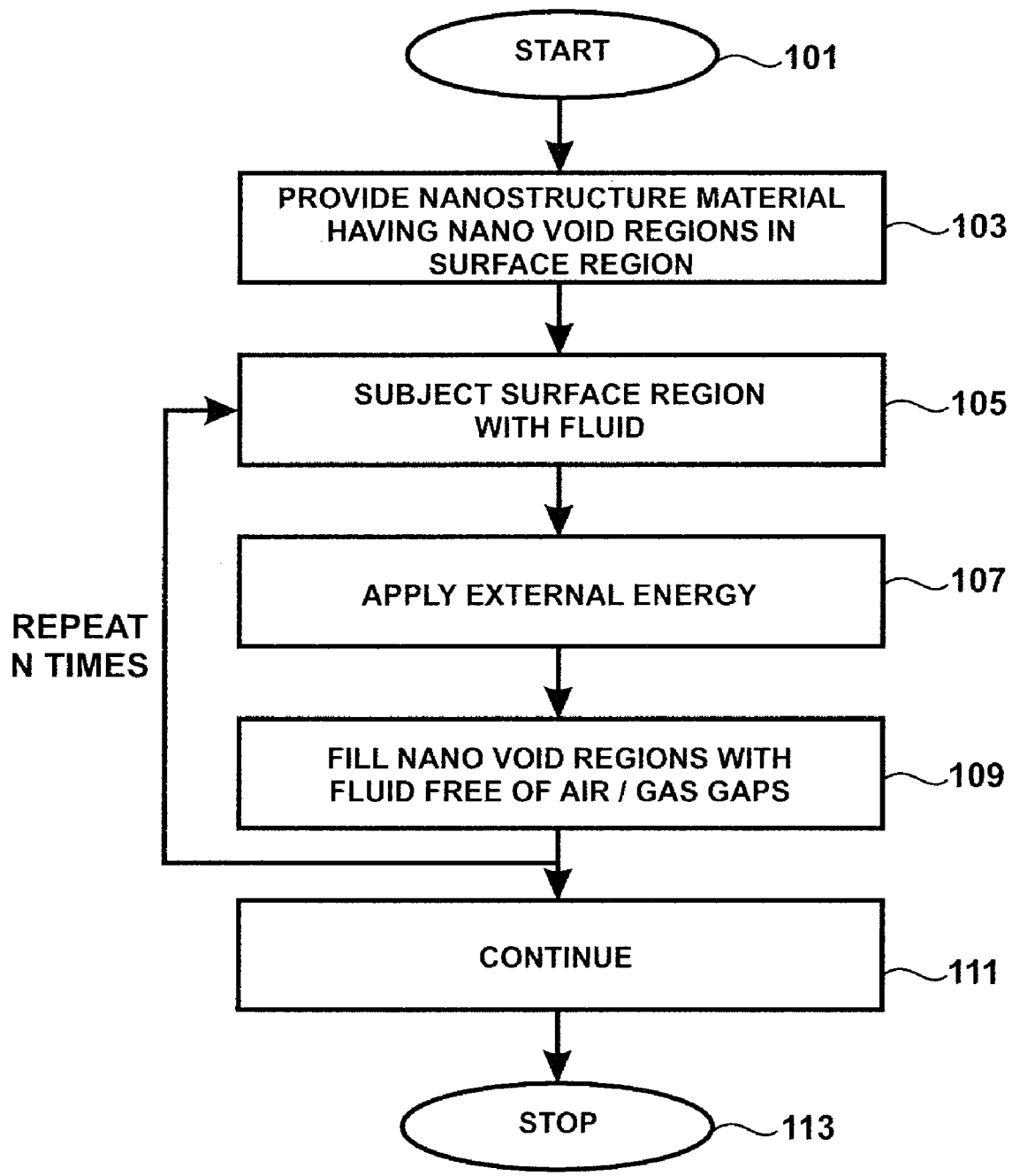
FIG. 1 is a simplified flow diagram illustrating a method of forming a nanostructure composite according to an embodiment of the present invention.

FIG. 1 is a simplified flow diagram illustrating a method 100 of forming a composite nano structure according to an embodiment of the present invention, which can be outlined below:

Start (Step 101);

Provide a nanostructure material (Step 103) having a surface region and one or more nano void regions. The nanostructure material can be a semiconductor material;

Subject a surface region of the nanostructure material to a fluid (Step 105);

Apply (Step 107) an external energy to the nanostructure and/or the fluid. For example, the external energy can be provided by a process selected from at least thermal, electrical, optical, electro-chemical, mechanical, pressure, gravitational, vacuum, or any one or more of these;

Substantially fill (Step 109) the one or more nano void regions with the fluid. In a specific embodiment, the one or more nanovoid regions including the fluid are free of air gaps;

Continue with other steps (Step 111); and

Stop (step 113).

The above sequence of steps illustrates a method of forming nanostructure composite according to an embodiment of the present invention. As shown, the method includes a combination of steps including a way of forming nanostructure composites. The method includes steps of using an external energy to fill one or more nano void regions in a nanostructure material. Depending on the embodiment, one or more steps may be added, one or more steps may be remove, or one or more steps are provided in a different sequence without departing from the scope of the claims herein. Further details of the present method can be found throughout the present specification and more particularly below.

Figure 2:
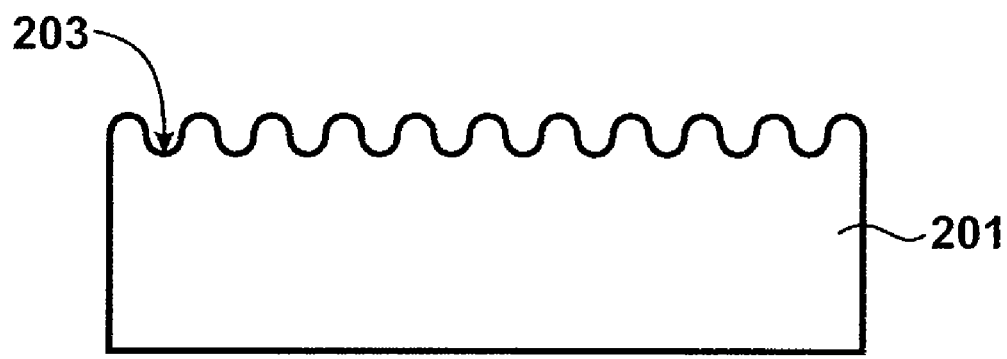
FIGS. 2-4 are simplified diagrams illustrating a method of forming a nanostructure composite according to an embodiment of the present invention.
Figure 3:
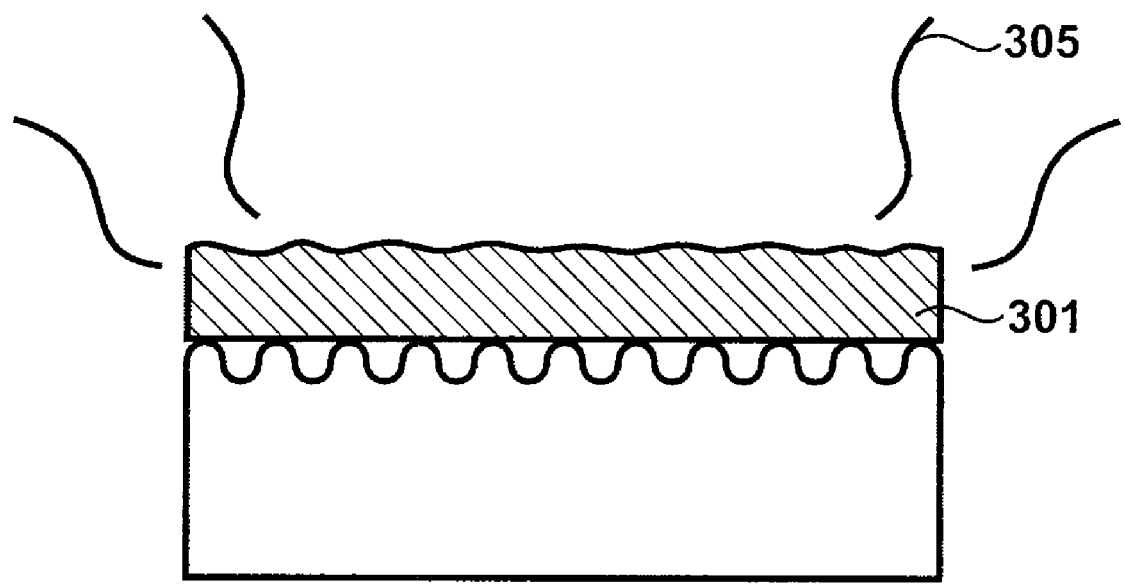
Figure 4:
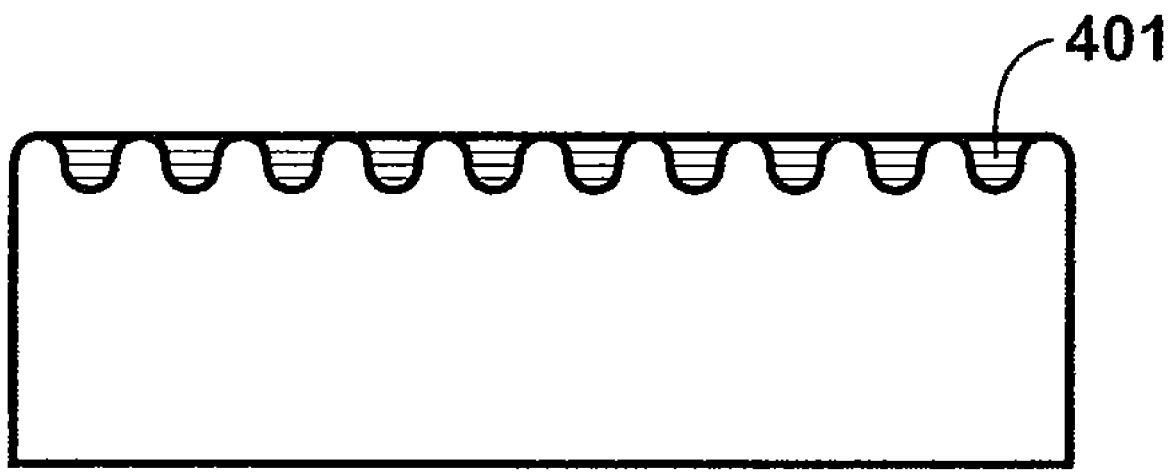

FIGS. 2-4 are a simplified diagrams illustrating a method of forming nanostructure composite according to an embodiment of the present embodiment. As shown in FIG. 2, a nanostructure material 201 is provided. The nanostructure material can be a nanoporous material in a specific embodiment. In alternative embodiments, the material can be nanoparticles, quantum dots, quantum wires, nano-columns, nanorods, nanotubes, quantum wells, nanoshells, nanobelts, or other combinations of nanoporous materials. Of course, there can be other variations, modifications, and alternatives.

In a specific embodiment, the nanostructure material can be an insulator, a conductor, or a semiconductor, including any combination of these and the like. In a specific embodiment, the insulator can be a glass, quartz, plastic, ceramic, or other type of homogeneous and/or composite and/or layered material. In a specific embodiment, the conductor can be a metal, a metal alloy, or any combination of these, and the like. Alternatively, the substrate member can be a semiconductor material, such as silicon, silicon on insulator, silicon-germanium alloys, Group III/V (e.g., GaAs), or Group II/VI materials, zinc oxides (e.g., ZnO), and the like. Of course, there can be other variations, modifications, and alternatives. The nanostructure material can include a semiconductor material. The semiconductor material can be subjected to a pattern and etch process known in the art to form the one or more nano void regions in a surface region in a specific embodiment.

Referring to FIG. 3, the method includes subjecting surface region, including the one or more nano void regions of the nanostructure material to a fluid 301. In a specific embodiment, the fluid can include a colloid material suspended in a suitable liquid, a precursor material, among others. In a specific embodiment, the nanostructure material including the fluid is subjected to an external energy 305. For example, the external energy can be applied using processes such as thermal, optical, electrically, electrochemical, mechanical, pressure, vacuum, gravitational, or any one or more of these in combination working in a parallel and/or serial manner. As merely an example, the nanostructure material including the fluid can be subjected to a vacuum. The vacuum removes trapped air/gas in the one or more nano void regions and allows the fluid to be driven into the one or more nano void regions. In a preferred embodiment, the one or more nano void regions are substantially filled with the fluid free of air gaps. Alternatively, the nano structure material can be maintained in a vacuum environment. The surface region including the one or more nano void regions is then subjected with the fluid. The vacuum environment removes trapped air/gas and allows the fluid to substantially fill the nano void regions free of air gaps. Of course there can be other modifications, variations, and alternatives.

In a specific embodiment, the fluid may be subjected to a heating process at a temperature ranging from room temperature to about a boiling temperature before subjecting the nanostructure material with the fluid. The heating process reduces a viscosity and/or surface tension of the fluid thereby facilitates the fluid to be driven into the one or more nano void regions of the nanostructure material. Alternatively, the nanostructure material may be subjected to a first heating process while maintaining in the vacuum to facilitate removal of the trapped air/gas. The heating process includes an increase of temperature of the nanostructure from a first temperature (for example, room temperature) to a boiling temperature of the fluid. The heating process also allows for a decrease of viscosity or surface tension of the fluid. Furthermore, the heating process can be applied after the nanostructure material has been subjected to the fluid. Of course one skilled in the art would recognize other modifications, variations, and alternatives.

Figure 5:
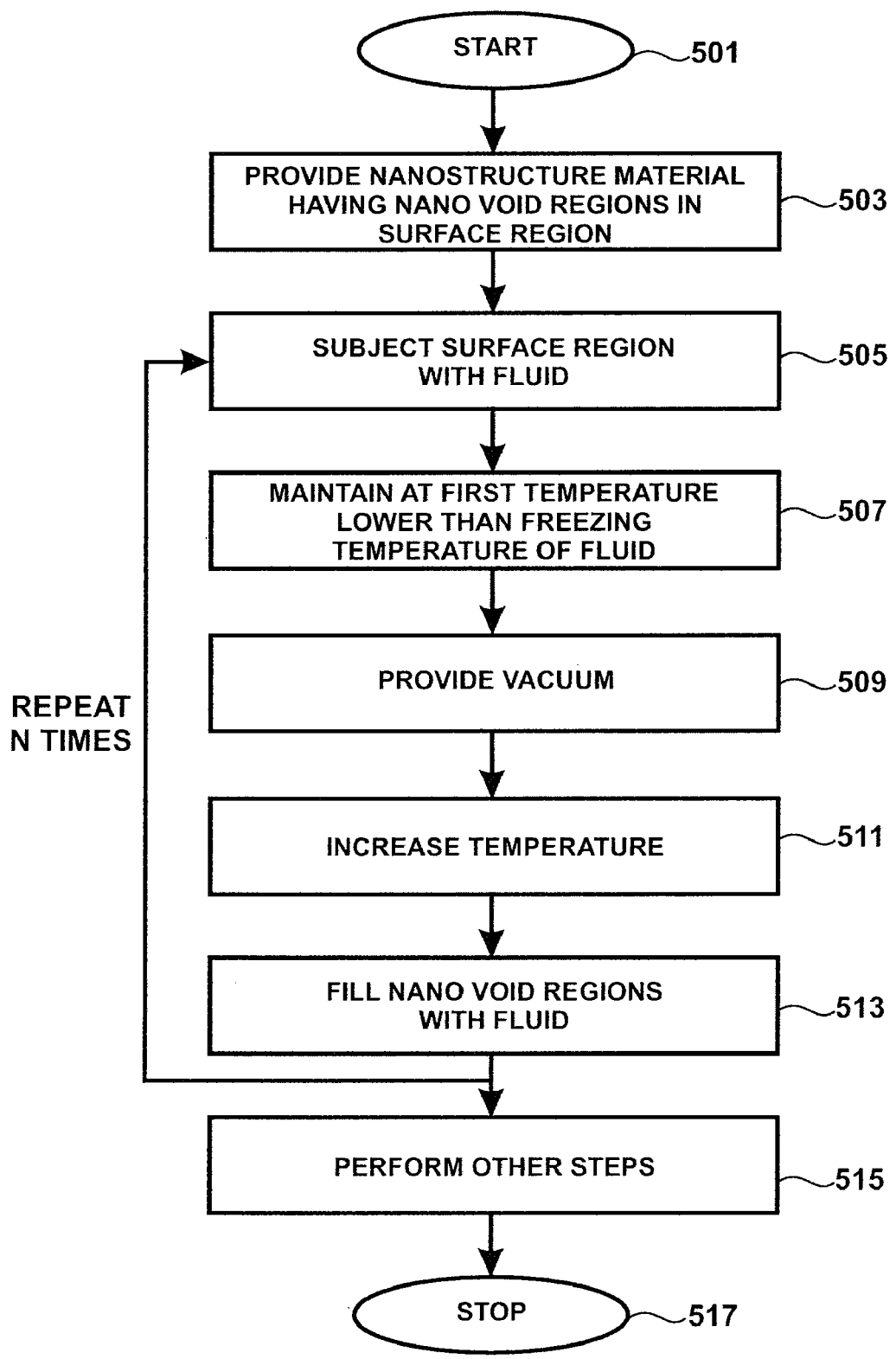
FIG. 5 is a simplified flow diagram illustrating an alternative method of forming a nanostructure composite according to an embodiment of the present invention.

FIG. 5 is a simplified process flow illustrating a method of forming nanostructure composite according to an embodiment of the present invention, which may be outline as follow:

Start (Step 501);
Provide a nanostructure material including one or more nano void regions within a thickness in a surface region (Step 503);
Subject the surface region of the nanostructure material with a fluid (Step 505);
Maintain the nanostructure material including the fluid at a first temperature lower than a freezing temperature of the fluid (Step 507);
Provide the nanostructure material including the fluid in a vacuum environment while maintaining the nanostructure material including the fluid at the first temperature (Step 509);
Increase the temperature of the nanostructure material including the fluid to a second temperature, the second temperature ranges from about room temperature to about boiling temperature of the fluid (Step 511);
Cause the one or more nano void regions to be filled with the fluid substantially free of air gaps; (Step 513);
Perform other steps (Step 515); and
End (Step 517).

The above sequence of steps illustrates a method of forming nanostructure composite according to an embodiment of the present invention. As shown, the method includes a combination of steps including a way of forming nanostructure composites. In a specific embodiment, the method includes steps of providing a nanostructure material including a fluid at a temperature below a freezing temperature of the fluid, subjecting the nanostructure material including the fluid to a vacuum, and increasing the temperature ranging from room temperature to boiling temperature of the fluid, to fill the one or more nano void regions in the nanostructure material. Depending on the embodiment, one or more steps may be added, one or more steps may be removed, or one or more steps are provided in a different sequence without departing from the scope of the claims herein. Further details of the present method can be found throughout the present specification and more particularly below.

Figure 6:
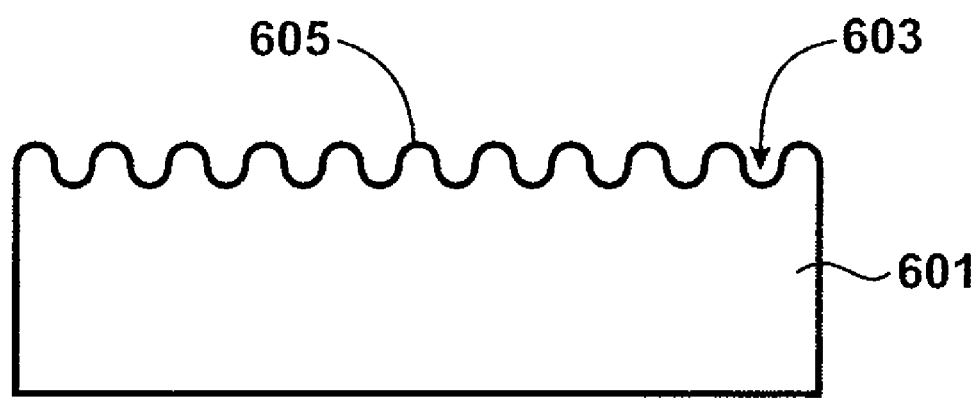
Figure 7:
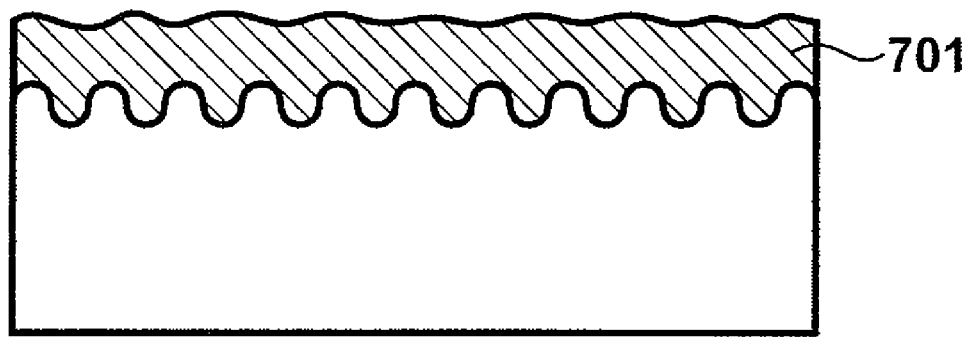
Figure 8:
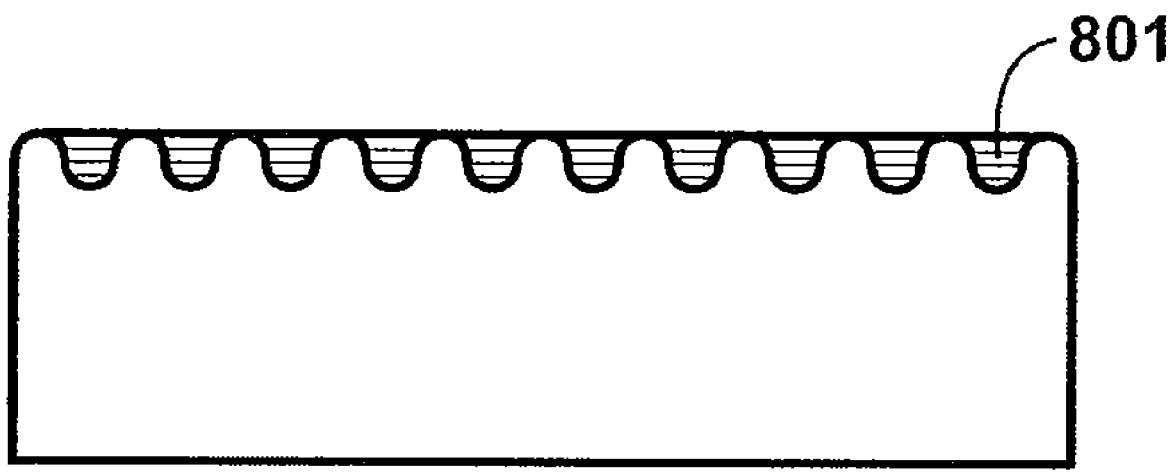

Referring to FIG. 6, a method of forming a nanostructure composite according to an embodiment of the present invention is illustrated. As shown, the method includes providing a nanostructure material 601 having a surface region. The nanostructure material includes one or more nano void regions 603 within a thickness of the surface region 605. In a specific embodiment, the nanostructure material can be a semiconductor material. The semiconductor material may be subjected to a pattern and etch process to provide for the one or more nano void regions in the thickness of the surface region in a specific embodiment. As shown in FIG. 7, the surface region of the nanostructure material is subjected with a fluid 701. The fluid can be a precursor material in certain embodiments. In a specific embodiment, the fluid may be a colloid material suspended in a suitable liquid. The nanostructure material including the fluid is maintained at a first temperature, the first temperature being provided at a temperature lower than at least a freezing temperature of the fluid. The method subjects the nanostructure material including the fluid to a vacuum while the nanostructure material including the fluid are maintained at the first temperature. In a preferred embodiment, the method includes increasing the temperature of the nanostructure material including the fluid to a temperature greater than at least the melting temperature of the fluid. Preferably, the fluid is driven into the one of more nano void regions to substantially fill the one or more nano void regions free of air gaps as shown in FIG. 8.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:
1. A method of forming composite nanostructures with one or more nanomaterial, the method comprising:
   providing a nanostructure material having a surface region and one or more nano void regions within a first thickness in the surface region;
   subjecting the surface region of the nanostructure material with a fluid; and
   applying an external energy to the fluid and/or the nanostructure material to drive in a portion of the fluid into one or more of the void regions and cause the one or more nano void regions to be substantially filled with the fluid and free from air gaps;
   wherein the nanostructure material consists of semiconductor material and wherein the surface region of the semiconductor material has been subjected to a pattern and etch process to form the nano void regions.
2. The method of claim 1 wherein the nanostructure material comprises a nanoporous material.

3. The method of claim 1 wherein the external energy is provided at least by a process selected from thermal, electrical, optical, electro-chemical, mechanical, pressure, vacuum, or any one or more of these.

4. The method of claim 1 wherein the fluid further comprises a colloid material suspended in a liquid.

5. The method of claim 4 wherein the liquid is removed from the one or more nanovoid regions using at least vacuum, heat, or a combination.

6. The method of claim 5 wherein the colloid material remained after removal of the liquid is further subjected to a sintering process or a densification process.

7. A method of composite nanostructures with one or more nano material, the method comprising:
    providing a nanostructure material having one or more nano void regions;
    maintaining the nanostructure material in a vacuum environment;
    subjecting a fluid to the one or more nanovoid regions while the nanostructure material is maintained in the vacuum environment to cause the one or more nano void regions to be substantially filled with the fluid free from air gaps;
    wherein the nanostructure material is a semiconductor material and wherein the semiconductor material is subjected to a pattern and etch process to provide for the nanovoid regions.

8. The method of claim 7 wherein the vacuum environment removes trapped air/gas in the nano void regions.

9. The method of claim 7 wherein the maintaining is provided before the subjecting step.

10. The method of claim 7 wherein the fluid is further subjected to one or more heating steps.

11. The method of claim 10 wherein the one or more heating steps reduce viscosity and surface tension of the fluid and remove trapped gases within the nano void regions.

12. The method of claim 10 wherein the one or more heating steps are provided at a temperature ranging from about room temperature to about boiling point of the fluid.

13. The method of claim 7 wherein the nanostructure material is a nanoporous material.

14. The method of claim 7 wherein the fluid further comprises a colloid material suspended in a liquid.

15. The method of claim 14 wherein the liquid is removed from the one or more nanovoid regions using at least vacuum, heat, or a combination.

16. The method of claim 14 wherein the colloid material remained after removal of the liquid is further subjected to a sintering process or a densification process.

17. A method of forming composite nanostructures with one or more nanomaterial, the method comprising:
    providing a nanostructure material having a surface region and one or more nano void regions within a thickness in a surface region;
    introducing a fluid to a vicinity of the surface region;
    maintaining the nanostructure material including the fluid at a first temperature, the first temperature being lower than at least a freezing temperature of the fluid;
    providing the nanostructure material including the fluid in a vacuum environment while maintaining the nanostructure material at the first temperature ;
    increasing the temperature of the nanostructure material from a first temperature to a second temperature; and
    driving the fluid into the one or more nano void regions to substantially fill the one or more nano void regions with the fluid free of air gap,
    wherein the maintaining of the nanostructure material including the fluid at a first temperature is provided before the driving of the fluid into the one or more nano void regions.

18. The method of claim 17 wherein the vacuum environment removes trapped air/gas in the nano void regions.

19. The method of claim 17 wherein the fluid is further subjected to one or more heating steps.

20. The method of claim 19 wherein the one or more heating steps reduce viscosity and surface tension of the fluid and remove trapped gases within the nano void regions.

21. The method of claim 19 wherein the one or more heating steps are provided at a temperature ranging from about room temperature to about boiling point of the fluid.

22. The method of claim 17 wherein the nanostructure material is a nanoporous material.

23. The method of claim 17 wherein the nanostructure material is a semiconductor material.

24. The method of claim 23 wherein the semiconductor material is subjected to a pattern and etch process to provide for the nano void regions.

25. The method of claim 17 wherein the fluid further comprises a colloid material suspended in a liquid.

26. The method of claim 25 wherein the liquid is removed from the one or more nanovoid regions using at least vacuum, heat, or a combination.

27. The method of claim 25 wherein the colloid material remained after removal of the liquid is further subjected to a sintering or a densification process.

* * * * *